(12) United States Patent
Suzuki (10) Patent No.: US 7,368,997 B2
(45) Date of Patent: May 6, 2008

(54) SIGNAL AMPLIFIER AND INTEGRATED CIRCUIT

(75) Inventor: Yasuyuki Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 122 days.

(21) Appl. No.: 10/510,282

(22) PCT Filed: Mar. 27, 2003

(86) PCT No.: PCT/JP03/03851

§ 371 (c)(1),
(2), (4) Date: Jan. 19, 2006

(87) PCT Pub. No.: WO03/085823

PCT Pub. Date: Oct. 16, 2003

(65) Prior Publication Data

US 2006/0125556 A1 Jun. 15, 2006

(30) Foreign Application Priority Data

Apr. 8, 2002 (JP) ............................. 2002-104707

(51) Int. Cl.
*H03F 3/191* (2006.01)

(52) U.S. Cl. ..................................... 330/302
(58) Field of Classification Search ................ 330/286, 330/302
See application file for complete search history.

(56) References Cited

U.S. PATENT DOCUMENTS 6,727,762 B1 * 4/2004 Kobayashi .................. 330/295

FOREIGN PATENT DOCUMENTS

| JP | 62-185358 | 8/1987 |
| JP | 1-205458 | 8/1989 |
| JP | 4-145712 | 5/1992 |
| JP | 5-62844 | 9/1993 |
| JP | 8-274553 A | 10/1996 |
| JP | 9-312526 | 12/1997 |
| JP | 11-88079 A | 3/1999 |

OTHER PUBLICATIONS

Yalcin Ayasli et al., "A Monolithic GaAs 1-13 GHz Traveling-Wave Amplifier" IEEE Trans., vol. MTT-30, No. 7, Jul. 1982, pp. 976-980.

* cited by examiner

*Primary Examiner*—Steven J. Mottola
(74) *Attorney, Agent, or Firm*—Young & Thompson (57) ABSTRACT

A signal amplifier and an integrated circuit capable of obtaining a high gain and high output in a wide range. The signal amplifier includes a pre-stage circuit for inputting a signal from outside and a post-stage circuit for amplifying the signal output from the pre-stage circuit and outputting it. The input impedance of the pre-stage circuit and the output impedance of the post-stage circuit are set so as to match with an external impedance within a frequency range of one digit or above. The output impedance of the pre-stage circuit and the input impedance of the post-stage circuit are set so as to match with an impedance lower than the output impedance of the post-stage circuit.

6 Claims, 11 Drawing Sheets

FIG. 6B
THIS TIME

SIGNAL AMPLIFIER AND INTEGRATED CIRCUIT

TECHNICAL FIELD

The present invention relates to an amplifier, and in particular, to a signal amplifier and an integrated circuit for amplifying a wide-band data signal with high power output.

BACKGROUND ART

Recently, with a need for highly sophisticated information signal processing, an integrated circuit capable of processing signals in a wider range is required. Particularly, in an optical communication system, the transfer rate is remarkably increased, and transfer rates of 2.4 gigabits per second (Gbps) and 10 Gbps are practically used. Besides, research and development have been intensively carried out for a transfer rate equal to or more than 40 Gbps. Since the signals multiplexed in such an optical communication system have a frequency component ranging from several tens of kiloherz (kHz) to several tens of gigaherz (GHz), a signal amplifier for use with a transceiver is required to have a wide-band and flat gain from several tens of kiloherz to several tens of gigaherz.

Figure 1:
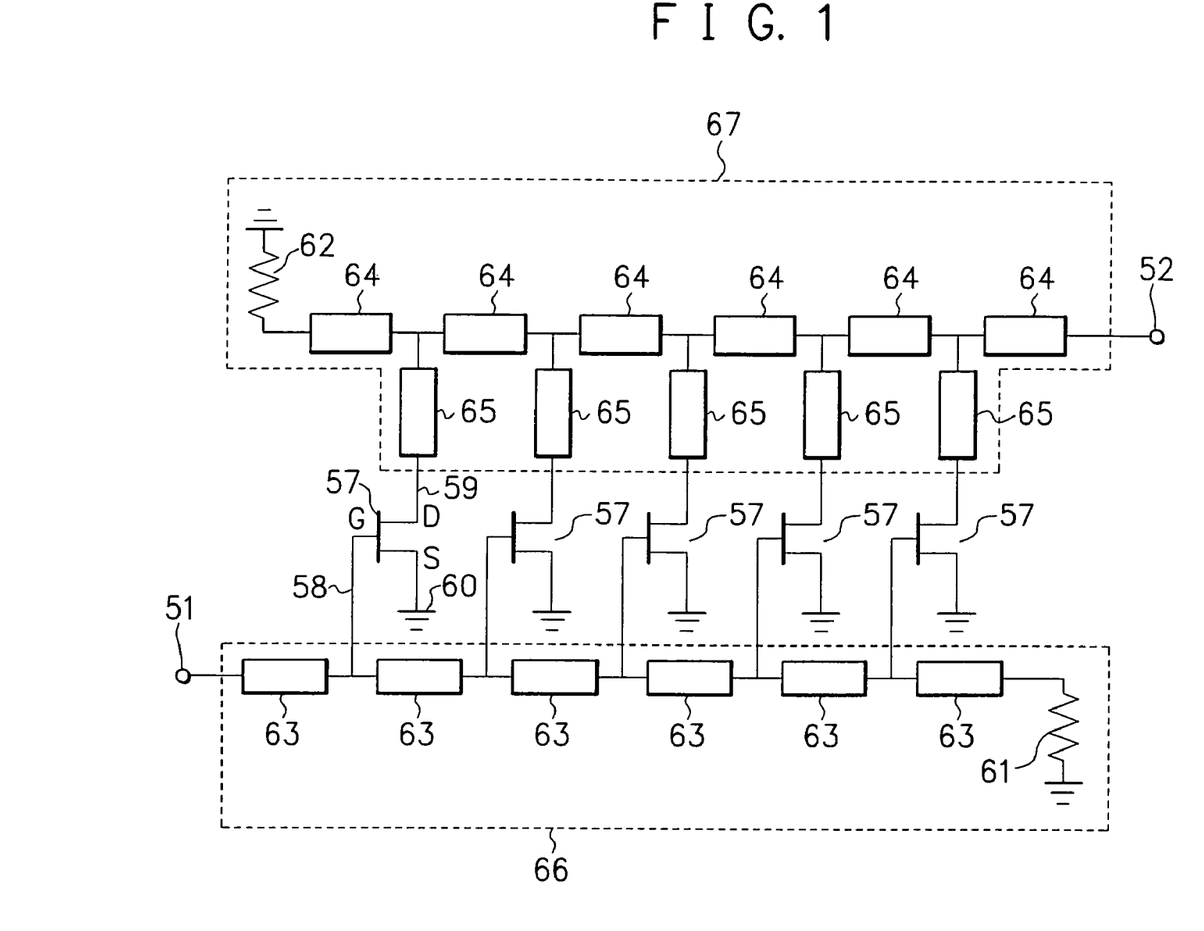
FIG. 1 is a diagram showing an outline of a configuration example of a conventional traveling-wave amplifier (traveling-wave amplifier circuit).

Furthermore, a circuit to drive an external modulator used in a transmitter and a circuit to directly drive a laser diode in an optical system require a maximum amplitude of six volt, and a high power output as well as aforementioned wide-band and flat gain characteristic are needed. As a wide-band signal amplifier, a traveling-wave amplifier (traveling-wave amplifier circuit) as shown in FIG. 1 has been reported (A Monolithic Gas 1-13 GHz Traveling-Wave Amplifier IEEE Trans., Vol. MTT-30, No. 7, July 1982, pp. 976-981). In FIG. 1, the numeral 51 denotes an input terminal, 52 denotes an output terminal, 57 denotes a field-effect transistor (hereinafter referred to as "FET"), 58 denotes an input terminal of the FET 57, 59 denotes an output terminal of the FET 57, 60 denotes a ground terminal of the FET 57, 61 denotes an input-side terminating resistor, 62 denotes an output-side terminating resistor, 63 and 64 denote distributed constant lines, and 65 denotes a phase adjusting line.

In the traveling-wave amplifier configured in this way, each of the distributed constant lines 63 and gate-source capacitance $C_{gs}$ of each FET 57 arranged adjacent thereto constitute a pseudo distributed constant line having characteristic impedance $Z_g$, and the pseudo distributed constant lines construct an input-side coupling circuit 66 together with the input-side terminating resistor 61. Additionally, drain-source capacitance $C_{ds}$ of each FET 57, each phase adjusting line 65, and each distributed constant line 64 form a pseudo distributed line, and the pseudo distributed lines form an output-side coupling circuit 67 together with the output-side terminating resistor 62.

Next, description will be given of operation of the traveling-wave amplifier of this kind. A signal received via the input terminal 51 propagates through each distributed constant line 63 in a direction to the input-side terminating resistor 61. Most signals propagating as described above are sequentially distributed to the respective FETs 57 to be amplified. On the other hand, unrequired signals not distributed to the FETs 57 are absorbed by the resistor 61. Therefore, the input-side coupling circuit 66 configured as above can in general obtain a good input reflection property in a wide band without using a matching circuit.

On the other hand, the signal received by each FET 57 is amplified according to a gate width of the FET 57 and then propagates through each phase adjusting line 65 and each distributed constant line 64 toward the output terminal 52. Moreover, since the respective propagation paths from the input terminal 51 to the output terminal 52 are selected to have an equal electric length, the signals amplified by the FETs 57 are sequentially combined with each other by the output-side coupling circuit 67 to be delivered to the output terminal 52. Thanks to the configuration of the circuit 67 described above, a good reflection property can be obtained in a wide band as on the input side.

As a general method to increase the power output from the traveling-wave amplifier of this type, there can be considered a method to increase the number of periodically disposed FETs 57 and a method to increase the gate width of each FET 57. Furthermore, the gain G of the traveling-wave amplifier of this type is approximately expressed as follows:

$$G \approx \frac{g_m^2 n^2 Z_g^2}{4}\left(1 - \frac{a_g l_g n}{2}\right)^2 \qquad \text{[Expression 1]}$$

wherein, $\alpha_g$ is an attenuation constant per unitary length of the gate-side circuit, $l_g$ is a gate-side line length per unitary cell of the FET 57, $Z_g$ is characteristic impedance of the gate-side line, n is the number of FETs 57.

According to the expression, if the number n of FETs 57 is not increased and an expression below is satisfied, the gain G is not increased.

$$n > \frac{l}{a_g l_g} \qquad \text{[Expression 2]}$$

Therefore, even if the number of FETs 57 is increased, the gain G is not increased, and the power output from the traveling-wave amplifier does not become higher as a result.

Furthermore, when the gate width of each FET 57 is increased, the gate-source capacitor $C_{gs}$ is increased and the cut-off frequency of the traveling-wave amplifier lowers, and hence a wide-band output cannot be obtained.

Figure 2:
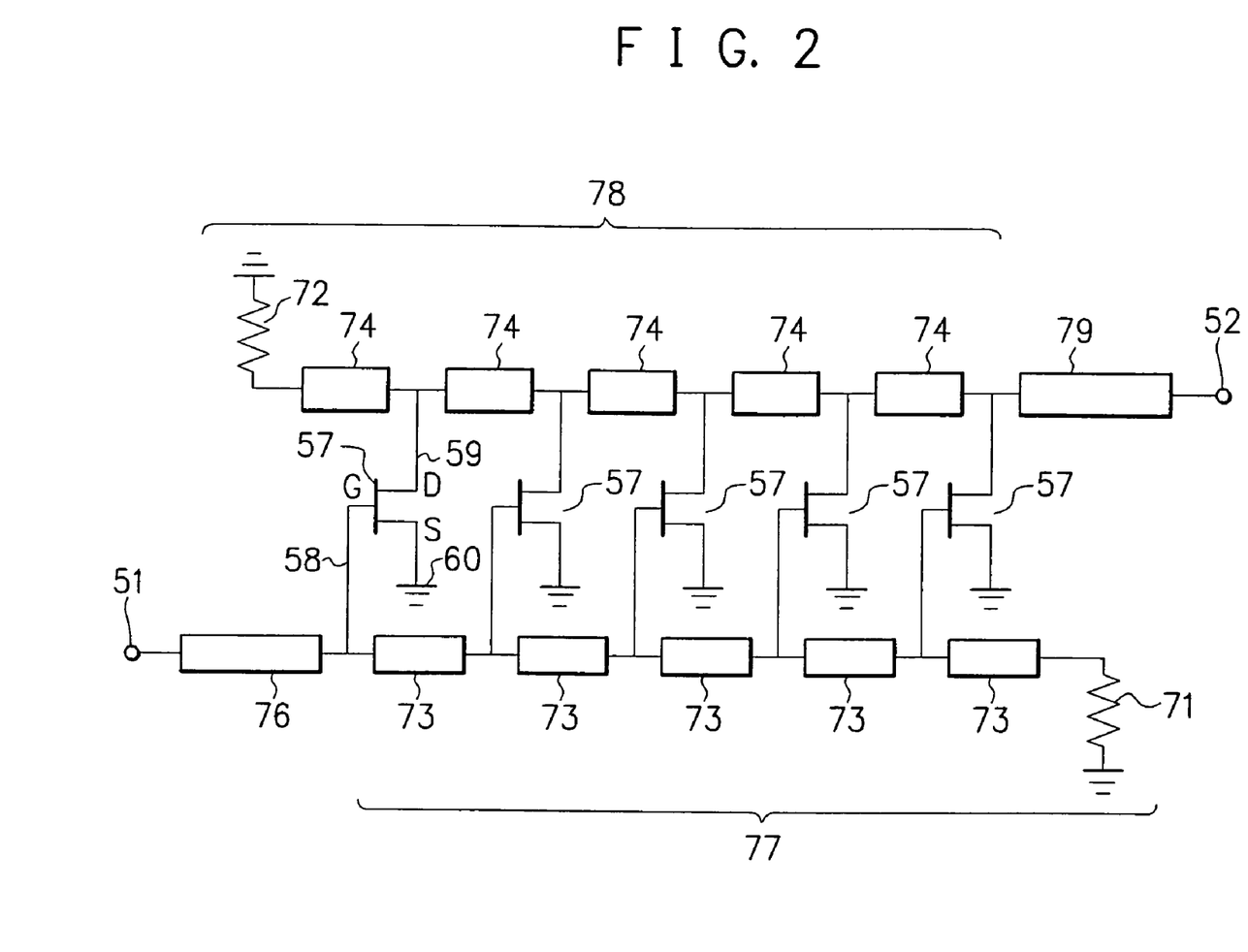
FIG. 2 is a diagram showing an outline of a configuration example of a conventional traveling-wave amplifier (traveling-wave amplifier circuit).

To solve the problem of this kind, Japanese Patent Application laid open No. HEI4-145712 has disclosed a traveling-wave amplifier as shown in FIG. 2. In this connection, the same constituent components of FIG. 2 as those of the traveling-wave amplifier shown in FIG. 1 are assigned with the same reference numerals and description thereof will be avoided.

In FIG. 2, the numeral 76 represents an input-side impedance matching circuit, 77 represents an input-side transmission line, 78 represents an output-side transmission line, and 79 represents an output-side impedance matching circuit. The matching circuit 76 is a circuit which matches external impedance (e.g., 50 ohm (Ω)) on an external input line side with a composite line impedance of the traveling-wave amplifier and which outputs therefrom an input signal from the external input line side without reflection of the input signal. The circuit 76 includes, for example, a 900 micrometer (μm) long matching line having 25 Ω. The input-side transmission line 77 is connected to the input-side impedance matching circuit 76.

The transmission line 77 includes a distributed constant line 73 (e.g., an 80 μm long line with a characteristic impedance of 35 Ω) and an input-side terminating resistor 71 (e.g., 8 Ω) and is linked with an FET 57.

The output-side transmission line 78 includes a distributed constant line 74 (e.g., an 80 μm long line with a characteristic impedance of 45 Ω) and an output-side terminating resistor 72 (e.g., 20 Ω) and is coupled with an output-side impedance matching circuit 79.

The matching circuit 79 is a circuit which matches external impedance (e.g., 50 Ω) on the external output line side with composite line impedance on the output side of the traveling-wave amplifier and which includes, for example, a 600 μm long, 25 Ω matching line.

According to an advantage of the traveling-wave amplifier shown in FIG. 2, since the composite line characteristic impedance on each of the input and output sides is set according to the gate width of the FET 57 to be lower than the external impedance, the gate width of the FET 57 which can be added for each unitary transmission length can be increased and it is hence possible to increase the power output of the traveling-wave amplifier.

Figure 3:
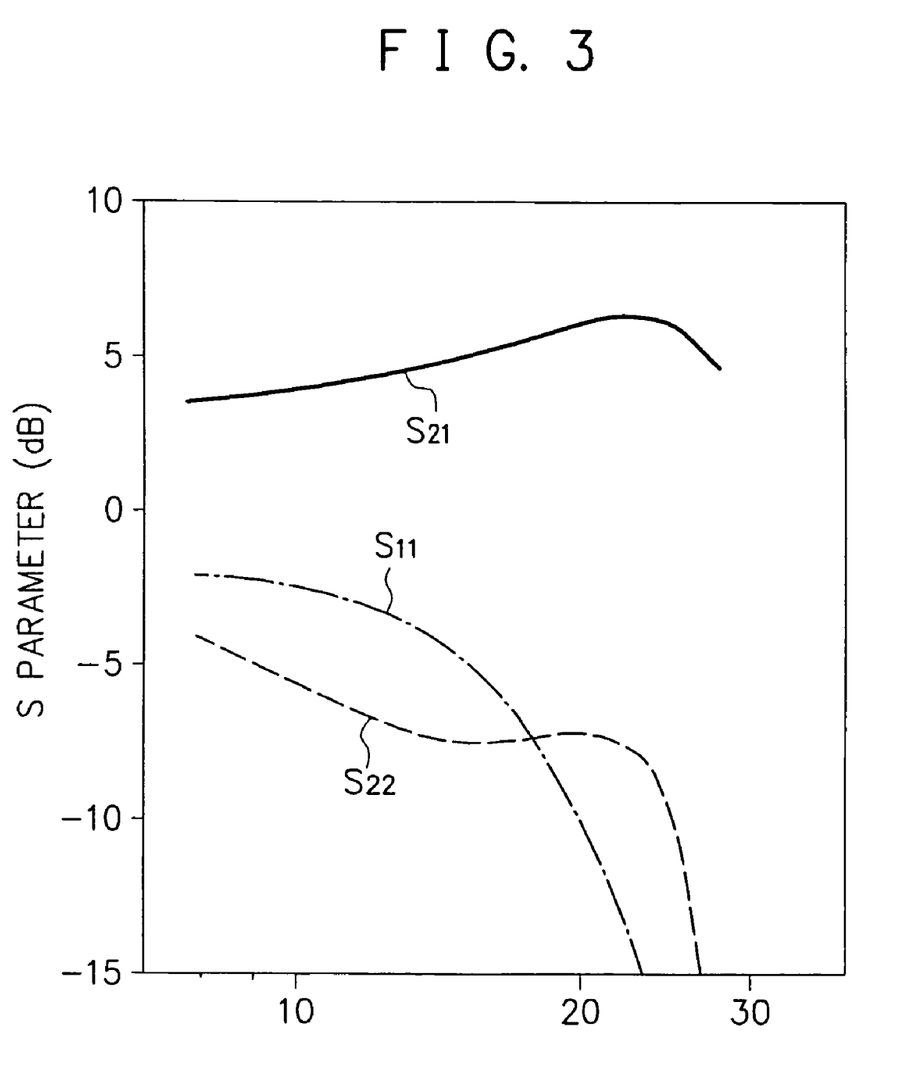
FIG. 3 is a graph showing frequency characteristics of a gain ($S_{11}$), input reflection ($S_{21}$), and output reflection ($S_{22}$) of the traveling-wave amplifier shown in FIG. 2.

FIG. 3 is a graph showing frequency characteristics of a gain ($S_{11}$), input reflection ($S_{21}$), and output reflection ($S_{22}$) of the traveling-wave amplifier shown in FIG. 2. As can be seen from FIG. 3, the gain G ($S_{11}$), the input reflection ($S_{21}$), and the output reflection ($S_{22}$) each have good characteristics in a band from about 20 GHz to about 30 GHz.

PROBLEMS THAT THE INVENTION IS TO SOLVE

However, in the traveling-wave amplifier shown in FIG. 2, since the composite line characteristic impedance on each of the input and output sides is set to be lower than the external impedance, although a good characteristic is viewed in a band from about 20 to 30 GHz (i.e., within a single-digit frequency range) as shown in FIG. 3, it is not possible to obtain the good characteristic in a wide range from several tens of kHz to several tens of GHz required for an amplifier used in a transceiver of an optical communication system.

The present invention, which has been devised to remove the problem, provides a signal amplifier and an integrated circuit capable of obtaining a high gain and a high power output in a wider band.

DISCLOSURE OF THE INVENTION

To achieve the object described above, there is provided a signal amplifier in accordance with the invention described in claim 1, the amplifier including a pre-stage circuit for inputting a signal from an external device and a post-stage circuit for amplifying the signal fed from the pre-stage circuit and outputting the signal therefrom, wherein input impedance of the pre-stage circuit and output impedance of the post-stage circuit are set so as to match external impedance in a frequency range of at least one figure; and output impedance of the pre-stage circuit and input impedance of the post-stage circuit are set to match at impedance lower than the output impedance of the post-stage circuit.

In this case, the signal delivered from the pre-stage circuit may be directly supplied to the post-stage circuit or may first pass, for example, a capacitor or other circuit to be supplied thereafter to the post-stage circuit.

In the configuration according to the invention, the input impedance of the pre-stage circuit and the output impedance of the post-stage circuit match the external impedance in a one or more-digit frequency range, and the output impedance of the pre-stage circuit matches the input impedance of the post-stage circuit at impedance lower than the output impedance of the post-stage circuit. This consequently suppresses lowering of the cut-off frequency and deterioration of the input reflection loss which are caused by an increase in the size and the number of stages of transistors to obtain high voltage amplitude, and a high gain and a high power output can be attained in a wide band, for example, from several tens of kHz to several tens of GHz (a frequency range of about six figures).

In accordance with the invention, in the signal amplifier the post-stage circuit includes a traveling-wave amplifier.

In accordance with the invention, since the input impedance of the post-stage circuit becomes lower, the input reflection loss characteristic can also be improved even when the size and the number of stages of transistors (or FETs) are increased in the traveling-wave amplifier.

In accordance with the invention, in the signal amplifier, the pre-stage circuit is configured to include an impedance transforming circuit.

In accordance with the invention, in the signal amplifier, the impedance transforming circuit is configured to include a traveling-wave amplifier.

In accordance with the invention in the signal amplifier, the impedance transforming circuit is configured to include an emitter follower circuit or a source follower circuit.

In accordance with the invention, in the signal amplifier, the impedance transforming circuit is configured to include a differential circuit.

In accordance with the invention, the output impedance of the pre-stage circuit can be lower than the input impedance of the pre-stage circuit by use of the impedance transforming circuit. Therefore, it is possible to match the output impedance of the pre-stage circuit with the input impedance of the post-stage circuit at low impedance.

In accordance with the invention, in the signal amplifier according to one of, an output section of the pre-stage circuit is coupled via a capacitor with an input section of the pre-stage circuit.

In accordance with the invention, a signal in a desired band can be transmitted from the pre-stage circuit to the post-stage circuit.

In accordance with the invention, in the signal amplifier the pre-stage circuit and the post-stage circuit are formed on the same substrate.

In accordance with the invention, there can be provided an integrated circuit capable of obtaining a high gain and a high power output in a wide band ranging from several tens of kHz to several tens of GHz (a frequency range of about six figures).

BRIEF DESCRIPTION OF DRAWINGS

FIG. 8 is a diagram showing frequency characteristics of input and output impedance of a pre-stage circuit 10a.

FIG. 9 is a diagram showing comparison of frequency characteristics of a gain G ($S_{11}$), input reflection ($S_{21}$), and output reflection ($S_{22}$) when the system includes a signal amplifier 1a.

Incidentally, reference numerals 1, 1a, and 1b indicate signal amplifiers. Reference numerals 10, 10a, and 10b indicate pre-stage circuits. Reference numeral 11 indicates a post-stage circuit. Reference numeral 12 indicates a capacitor. Reference numerals 13 and 15 designate input terminals. Reference numerals 14 and 16 designate output terminals. Reference numerals 20, 30, 40, and 43 indicate bipolar transistors. Reference numerals 21, 31, and 44 indicate input-side terminating resistors. Reference numerals 22, 32, and 47 designate output-side terminating resistors. Reference numerals 23, 24, 33, 34, 45, and 48 designate distributed constant lines. Reference numerals 25, 35, and 49 indicate phase adjusting lines. Reference numerals 26, 36, and 46 indicate output-side coupling circuits. Reference numerals 27, 37, and 47 indicate input-side coupling circuits. Reference numeral 41 indicates an input-side resistor. Reference numeral 42 indicates an output-side resistor. Reference symbol La indicates an inductance component of a distributed constant line. Reference symbol Cc indicates a capacitive component of a pseudo distributed constant line. Reference symbol Cπ indicates an input capacitive component of a transistor. Reference symbol Cμ indicates an output capacitive component of a transistor. Reference numeral S11 indicates gain G. Reference numeral S21 indicates input reflection. Reference numeral S22 designates output reflection.

BEST MODE FOR CARRYING OUT THE INVENTION

Referring now to the accompanying drawings, description will be given of a favorable mode for carrying out the present invention.

First Embodiment

First, referring to FIG. 4, description will be given of a configuration of a signal amplifier in a first embodiment of the present invention.

Figure 4:
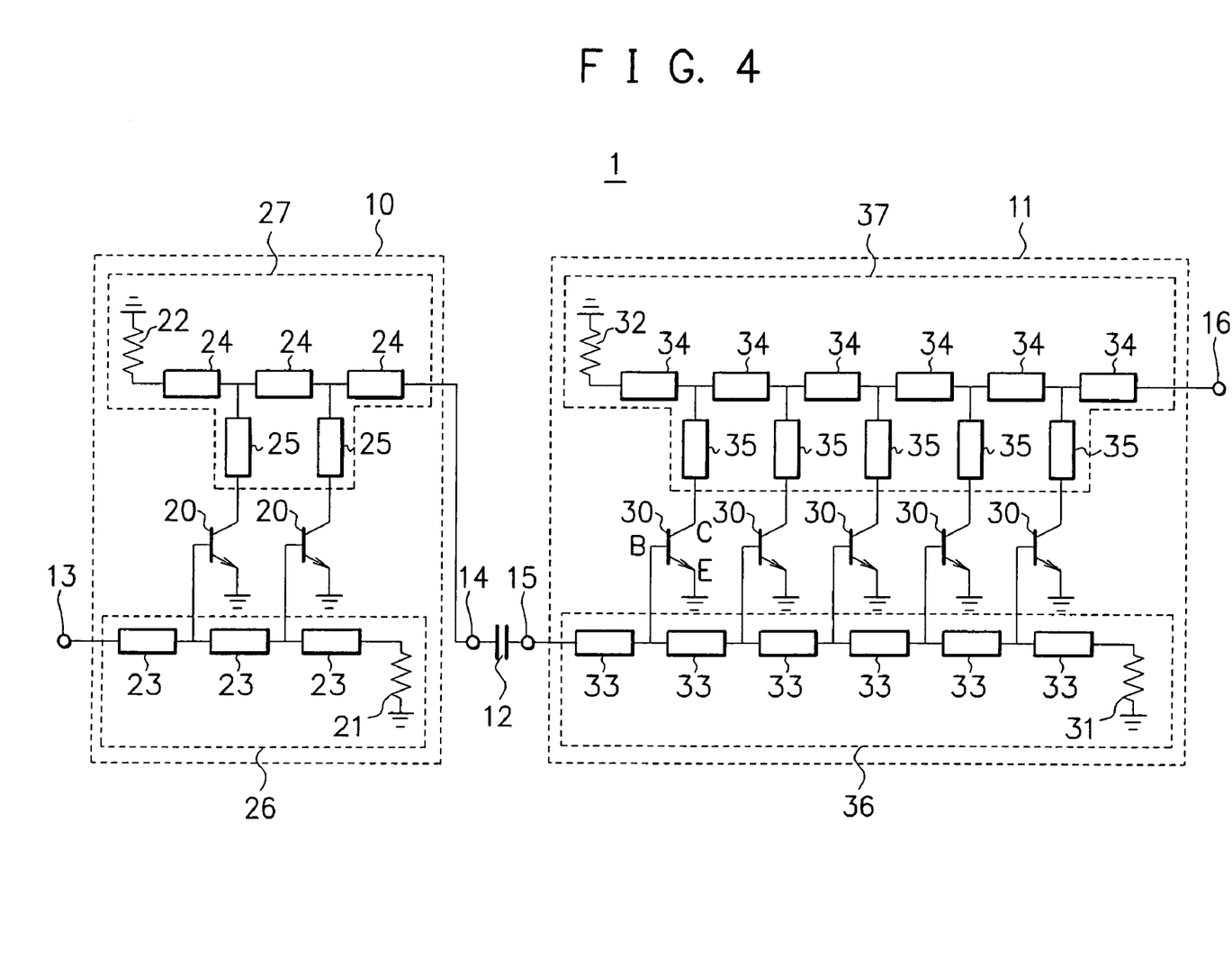
FIG. 4 is a diagram showing an outline of a configuration example of a signal amplifier in a first embodiment.

FIG. 4 is a diagram showing an outline of a configuration example of a signal amplifier in the first embodiment.

As shown in FIG. 4, the signal amplifier 1 includes a pre-stage circuit 10 to input a signal from an external device and a post-stage circuit 11 to amplify a signal fed from the pre-stage circuit 10 to output the signal therefrom. Moreover, the circuit 10 includes an output terminal 14 connected via a capacitor 12 to an input terminal 15 of the post-stage circuit 11. As the capacitor 12, a 0.35 microfarad (μF) condenser is employed to pass a signal with a frequency equal to or more than, for example, 30 kHz.

Incidentally, in the configuration of the first embodiment, the post-stage circuit 11 includes a traveling-wave amplifier and the pre-stage circuit 10 includes a traveling-wave amplifier to provide a function serving as an impedance transforming circuit.

Additionally, the pre-stage circuit 10 and the post-stage circuit 11 are formed on one substrate together with a direct-current (DC) bias circuit, not shown, to configure an integrated circuit.

The pre-stage circuit 10 shown in FIG. 4 includes a bipolar transistor (hereinafter simply referred to as "transistor") 20, an input-side terminating resistor 21, an output-side terminating resistor 22, distributed constant lines 23 and 24, and a phase adjusting line 25. In the pre-stage circuit 10, each distributed constant line 23 and base-emitter capacitance $C_{be1}$ of each transistor 20 disposed adjacent to the line 23 configure a pseudo distributed constant line having characteristic impedance $Z_{g11}$, and the pseudo distributed constant lines and the input-side terminating resistor 21 configure an input-side coupling circuit 26. Furthermore, collector-emitter capacitance $C_{ce1}$ of each transistor 20, each phase adjusting line 25, and each distributed constant line 24 form a pseudo distributed constant line having characteristic impedance $Z_{g12}$, and the pseudo distributed constant lines and the output-side terminating resistor 22 configure an output-side coupling circuit 27.

Additionally, the post-stage circuit 11 shown in FIG. 4 includes a transistor 30, an input-side terminating resistor 31, an output-side terminating resistor 32, distributed constant lines 33 and 34, and a phase adjusting line 35. In the post-stage circuit 11, each distributed constant line 33 and base-emitter capacitance $C_{be2}$ of each transistor 30 disposed adjacent to the line 33 configure a pseudo distributed constant line having characteristic impedance $Z_{g21}$, and the pseudo distributed constant lines and the input-side terminating resistor 31 configure an input-side coupling circuit 36. Furthermore, a collector-emitter capacitance $C_{ce2}$ of each transistor 30, each phase adjusting line 35, and each distributed constant line 34 configure a pseudo distributed constant line, and the pseudo distributed constant lines and the output-side terminating resistor 32 configure an output-side coupling circuit 37.

Incidentally, internal operation of the signal amplifier 1 described above is similar to that of the conventional traveling-wave amplifier described in connection with FIG. 1, and hence description thereof will be avoided.

In the configuration of the signal amplifier 1 described above, input impedance of the pre-stage circuit 10 (impedance of the input-side coupling circuit 26) and output impedance of the post-stage circuit 11 (impedance of the output-side coupling circuit 37) are set so as to match external impedance. In this situation, by disposing a traveling-wave amplifier in the pre-stage circuit 10, the input impedance of the pre-stage circuit 10 and the output impedance of the post-stage circuit 11 match the external impedance in a one or more-digit frequency range.

Moreover, output impedance of the pre-stage circuit 10 (impedance of the out-side coupling circuit 27) and input impedance of the post-stage circuit 11 (impedance of the input-side coupling circuit 36) are set to match at impedance lower than the output impedance of the post-stage circuit 11 (impedance of the output-side coupling circuit 37).

For example, when the output-side external impedance of the post-stage circuit 11 is 50 Ω (e.g., when a modulator having an input impedance of 50 Ω is connected to the output terminal 16 of the circuit 11), the output impedance of the post-stage circuit 11 is set to 50 Ω to match the output-side external impedance described above. Additionally, when the input-side external impedance of the pre-stage circuit 10 is 50 Ω, the input impedance of the pre-stage circuit 10 is set to 50 Ω to match the input-side external impedance described above.

Furthermore, the output impedance of the pre-stage circuit 10 and the input impedance of the post-stage circuit 11 are set to match at 15 Ω, which is lower than the output impedance, i.e., 50 Ω of the post-stage circuit 11.

Incidentally, in this case, since the output-side external impedance of the post-stage circuit 11 is 50 Ω and the output impedance of the post-stage circuit 11 is 50 Ω, load of the power output of each transistor 30 in the post-stage circuit is 25 Ω. When power output amplitude required to drive the modulator linked with the output terminal 16 of the post-stage circuit 11 is 3.5 $V_{p-p}$, a required current to be supplied from the post-stage circuit 11 is 140 milliampere (mA; 3.5 V/25 Ω). When a maximum current of 30 mA flows through a transistor 30 of one stage, it is only necessary to dispose five stages of transistors 30 as shown in FIG. 4.

Figure 5:
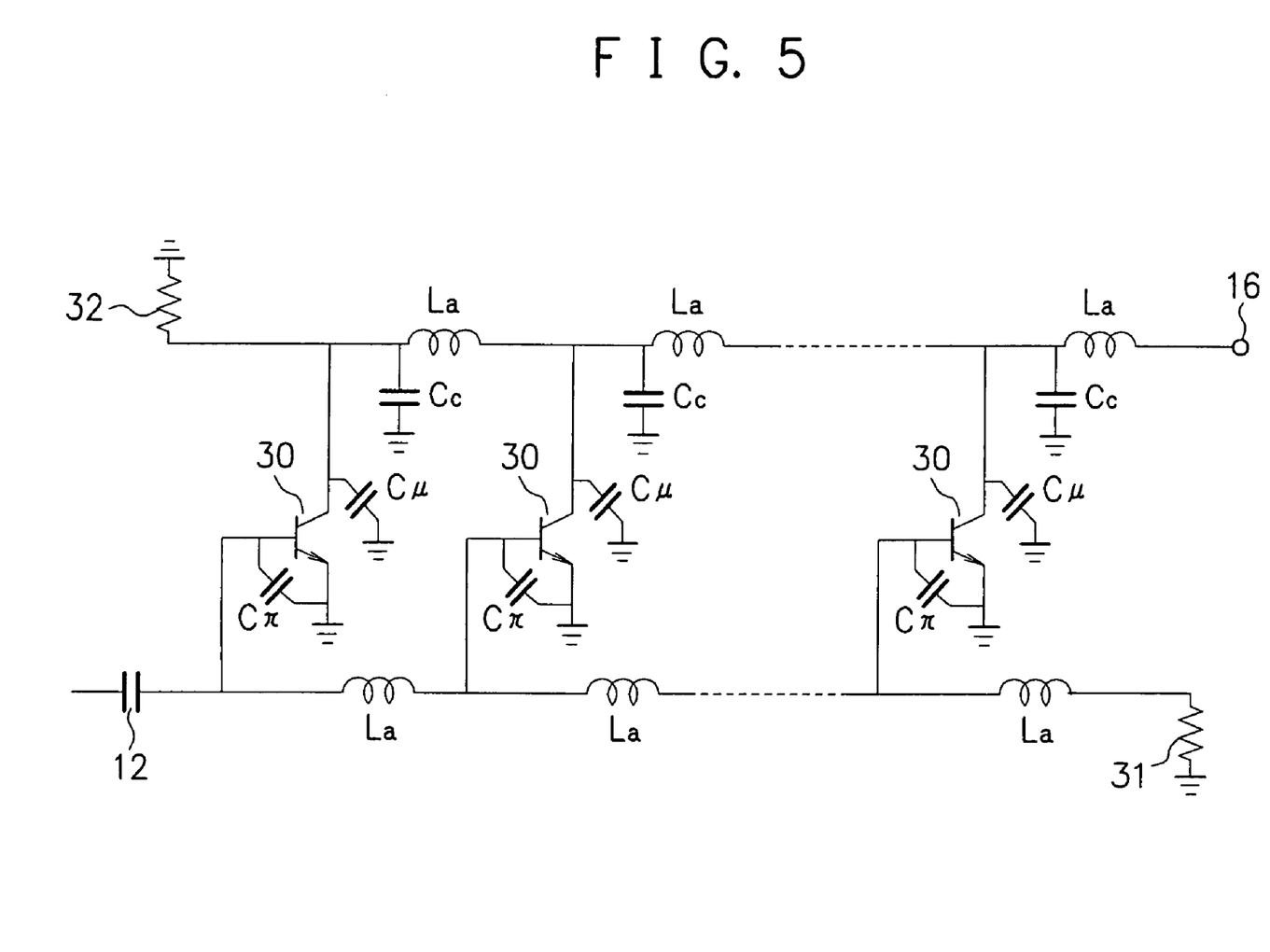
FIG. 5 is a diagram showing a concentration constant circuit in a traveling-wave amplifier of a post-stage circuit 11.

Referring now to FIGS. 5 and 6, description will be given of an advantage attained by the configuration of the signal amplifier 1 described above.

FIG. 5 is a diagram showing a concentration constant circuit in the traveling-wave amplifier of the post-stage circuit 11. In FIG. 5, $L_a$ is an inductance component of the distributed constant line (33 and 35), $C_c$ is a capacitive component of the pseudo distributed constant line, Cπ is an input capacitive component of the transistor 30, and Cμ is an output capacitive component of the transistor 30.

Assume that the input-side impedance and the output-side impedance of the post-stage circuit 11 are $Z_{in}$ and $Z_{out}$, respectively. Then, $$Z_{in} = \sqrt{\frac{La}{C\pi}} \qquad \text{[Expression 3]}$$

$$Z_{out} = \sqrt{\frac{La}{C\mu + C_c}}$$

are obtained.

Moreover, the cut-off frequency f of the traveling-wave amplifier of the post-stage circuit 11 is represented as below.

$$f \approx \frac{1}{\pi\sqrt{LaC\pi}} \cdot \frac{1}{\sqrt{n}} \qquad \text{[Expression 4]}$$

In this situation, as described above, since the input impedance of the post-stage circuit 11 is set to impedance matching at 15 Ω, which is lower than the external impedance 50 Ω, the cut-off frequency f is represented as follows:

$$f \approx \frac{1}{\pi 15 C\pi} \cdot \frac{1}{\sqrt{\pi}} > \frac{1}{\pi 50 C\pi} \cdot \frac{1}{\sqrt{n}} \qquad \text{[Expression 5]}$$

and hence the band improvement can be achieved.

Moreover, since the input impedance of the post-stage circuit 11 is low, the input reflection loss characteristic is also improved even if the transistor 30 is increased in size.

Additionally, for the gain G of the signal amplifier 1, since the traveling-wave amplifier of the post-stage circuit 11 becomes dominant, the gain of the traveling-wave amplifier of the pre-stage circuit 10 may be small, and hence the number of stages of transistors 20 can be reduced. Therefore, the cut-off frequency can be increased.

Figure 6A:
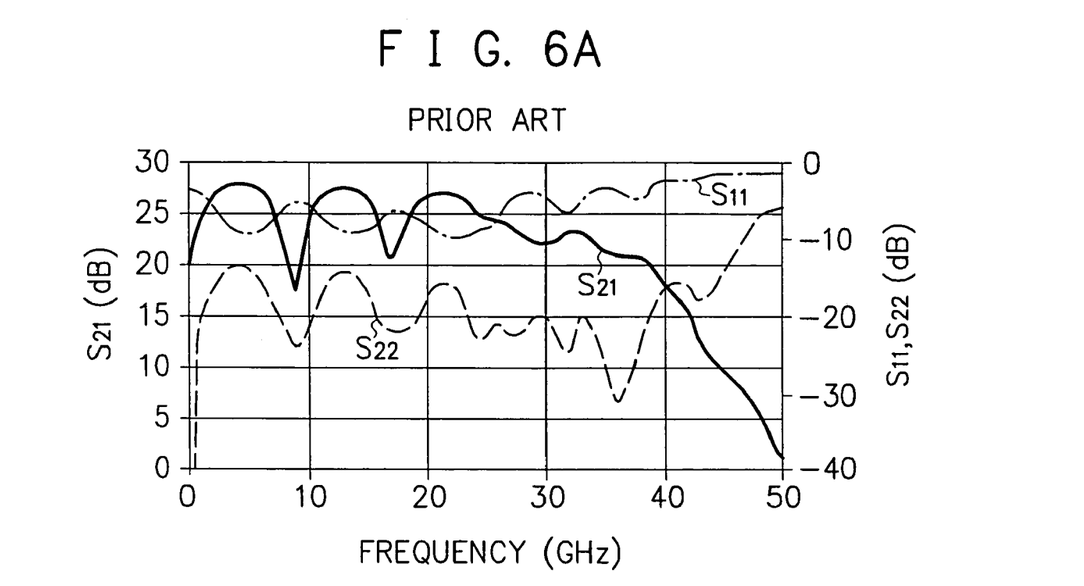
FIG. 6 is a diagram showing comparison of frequency characteristics of a gain G ($S_{11}$), input reflection ($S_{21}$), and output reflection ($S_{22}$) between the case where the traveling-wave amplifier is configured in one stage as in the prior art and the case where the system includes a signal amplifier 1.
Figure 6B:
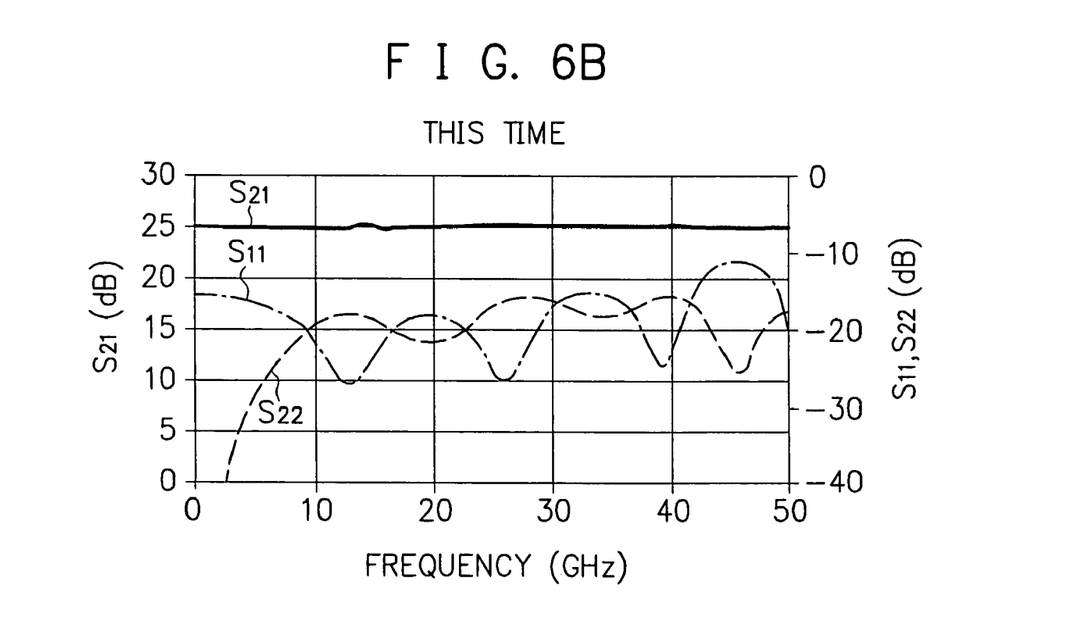

FIG. 6 is a diagram showing comparison of frequency characteristics of the gain G ($S_{11}$), the input reflection ($S_{21}$), and the output reflection ($S_{22}$) between the case (FIG. 6(A)) where the traveling-wave amplifier is in a one-stage configuration as in the prior art and the case (FIG. 6(B)) of the configuration of the signal amplifier 1.

As shown in FIG. 6, in the configuration of the signal amplifier 1 as compared with the configuration in which the traveling-wave amplifier is in a one-stage configuration as in the prior art, it can be recognized that the gain G ($S_{11}$), the input reflection ($S_{21}$), and the output reflection ($S_{22}$) are improved. Furthermore, in FIG. 6 in which the unit of frequency along the abscissa is "GHz", it can be confirmed according to experimental results that the gain G ($S_{11}$), the input reflection ($S_{21}$), and the output reflection ($S_{22}$) are improved in a wide band (a frequency range of about six figures) from several tens of kHz (e.g., about 30 kHz) to 50 GHz.

In this connection, judging from experimental results, it can be considered that the gain G ($S_{11}$), the input reflection ($S_{21}$), and the output reflection ($S_{22}$) are improved in a wider band, namely, a band (a frequency range of about eight figures) from several tens of kHz to 200 GHz.

As described above, in the configuration according to the first embodiment, the input impedance of the pre-stage circuit 10 and the output impedance of the post-stage circuit 11 match the external impedance in a one or more-digit frequency range and the output impedance of the pre-stage circuit 10 matches the input impedance of the post-stage circuit 11 at impedance lower than the output impedance of the post-stage circuit 11. It is consequently possible to suppress reduction in the cut-off frequency and deterioration of the input reflection loss which are caused by an increase in the size and stages of transistors to obtain high voltage amplitude, and a high gain and a high power output can be obtained in a wide band from several tens of kHz to several tens of GHz (a frequency range of about six figures).

Incidentally, in the configuration of the first embodiment, the pre-stage circuit 10 and the post-stage circuit 11 include grounded-emitter transistors. However, an advantage similar to that described above can be obtained by a traveling-wave amplifier of a cascode configuration in which a grounded-emitter transistor is connected to a grounded-base transistor.

Furthermore, in the configuration of the first embodiment, the pre-stage circuit 10 and the post-stage circuit 11 include bipolar transistors. However, other amplifying elements such as FETs and metal oxide semiconductor field-effect transistors (MOSFETs) may also be used to configure the circuits.

Second Embodiment

Figure 7:
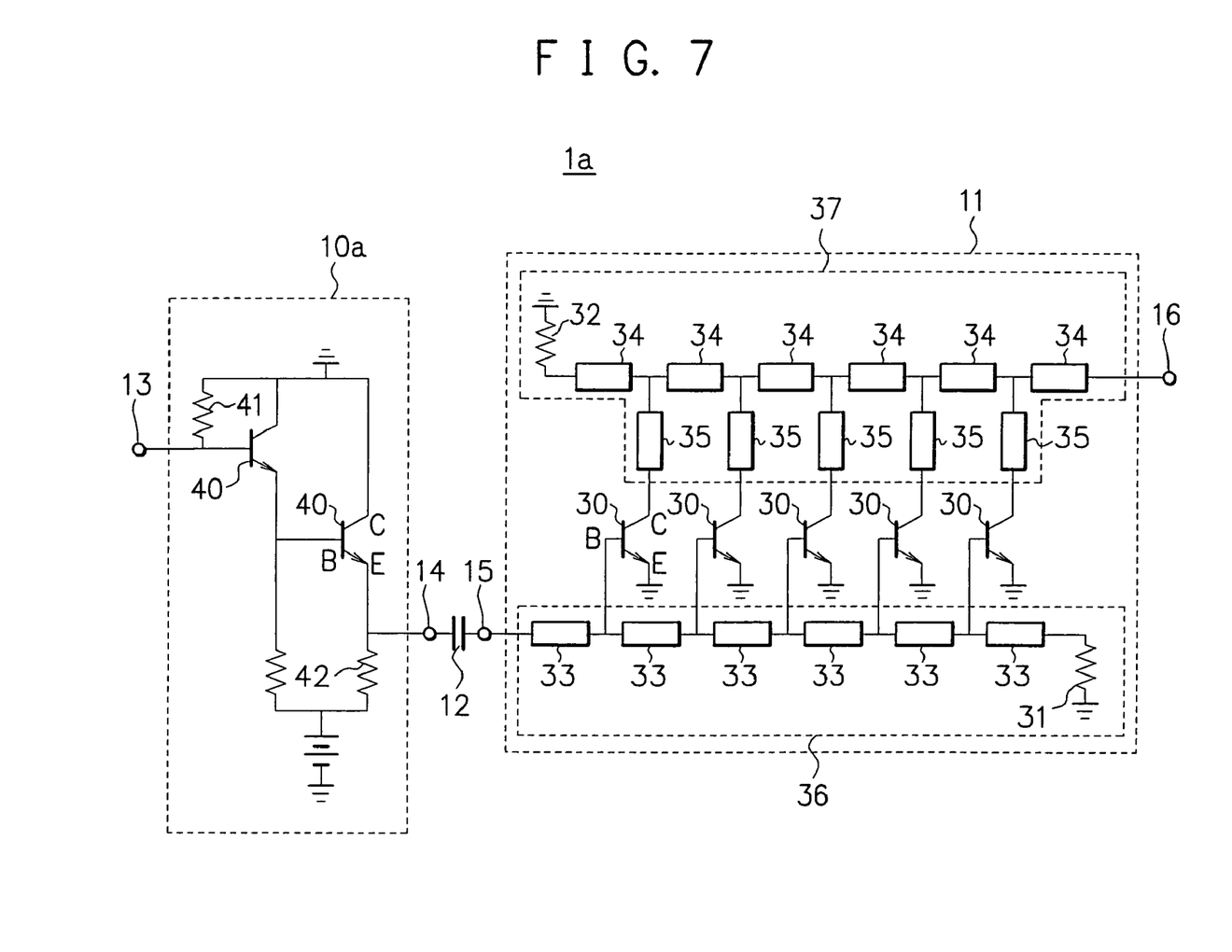
FIG. 7 is a diagram showing an outline of a configuration example of a signal amplifier in a second embodiment.

Referring next to FIG. 7, description will be given of a configuration of a signal amplifier in a second embodiment of the present invention.

FIG. 7 is a diagram showing an outline of a configuration example of a signal amplifier in the second embodiment.

Incidentally, in an signal amplifier 1a of the second embodiment, the same constituent components as those of the signal amplifier 1 of the first embodiment will be designated by the same reference numerals, and the duplicated description thereof will be avoided.

As shown in FIG. 7, the signal amplifier 1a includes a pre-stage circuit 10a to input a signal from an external device and a post-stage circuit 11 to amplify a signal fed from the pre-stage circuit 10a to output the signal therefrom.

Additionally, the pre-stage circuit 10a and the post-stage circuit 11 are formed on the same substrate together with a direct-current (DC) bias circuit, not shown, to configure an integrated circuit.

The pre-stage circuit 10a shown in FIG. 7 includes a two-stage emitter-follower circuit, which has low output impedance as well known, having transistors 40. That is, the pre-stage circuit 10a has a function as an impedance transforming circuit by including the emitter-follower circuit. Moreover, in the pre-stage circuit 10a, an input-side resistor 41 determines input impedance of the pre-stage circuit 10a, and an output-side resistor 42 determines output impedance of the pre-stage circuit 10a.

In the configuration of the signal amplifier 1a as above, when the input-side external impedance is, for example, 50 Ω, the input impedance of the pre-stage circuit 10a (impedance of the input-side resistor 41) is set to 50 Ω to match the input-side external impedance. In the configuration, by disposing an emitter-follower circuit in the pre-stage circuit 10a, the input impedance of the pre-stage circuit 10a and the output impedance of the post-stage circuit 11 match the external impedance in a one or more-digit frequency range. Additionally, the output impedance of the post-stage circuit 11 (impedance of the output-side coupling circuit 37) is set to 50 Ω to match the output-side external impedance as in the first embodiment. Moreover, the output impedance of the pre-stage circuit 10a (impedance of the output-side resistor 42) and the input impedance of the post-stage circuit 11 (impedance of the input-side coupling circuit 36) are set to, for example, 15 Ω to match at impedance lower than the output impedance of the post-stage circuit 11 (impedance of the output-side coupling circuit 37).

Figure 8:
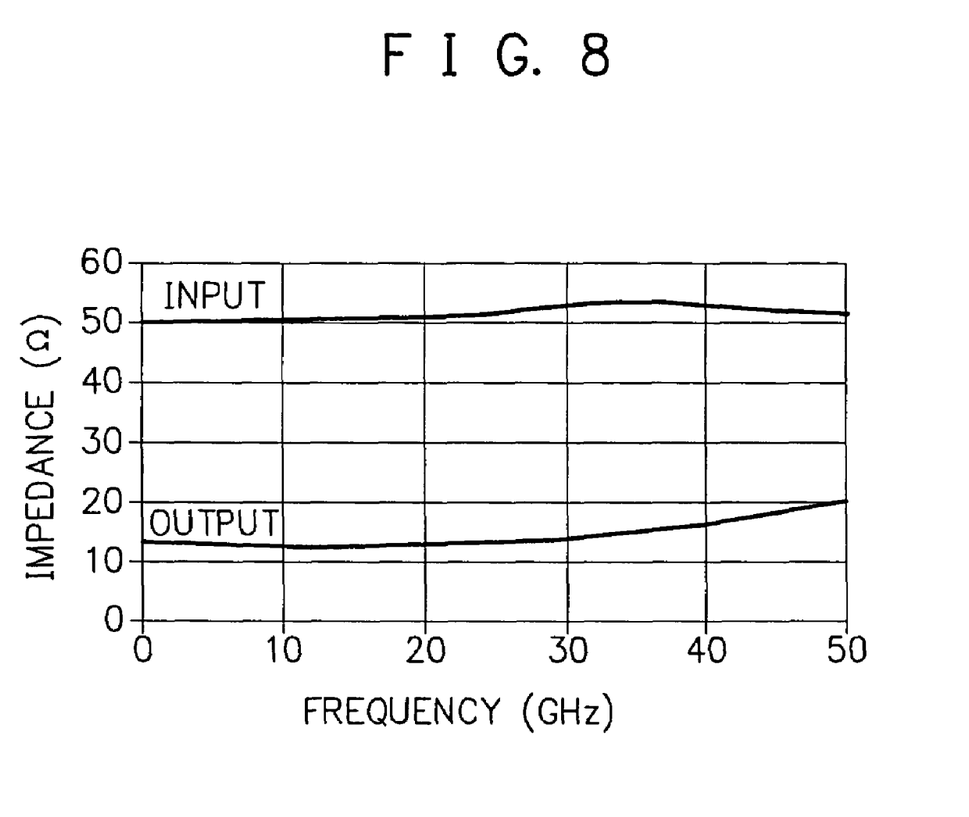

FIG. 8 is a diagram showing frequency characteristics of the input impedance and the output impedance of the pre-stage circuit 10a.

As shown in FIG. 8, in a wide-band frequency range, the input impedance of the pre-stage circuit 10a is about 50 Ω and the output impedance thereof is about 15 Ω, and the input impedance matches the input-side external impedance and the output impedance matches the input impedance of the post-stage circuit 11. According to experimental results, it is confirmed that the matching is kept established in a wide-band frequency range from several tens of kHz (e.g., about 30 kHz) to 50 GHz.

Furthermore, the two-stage emitter-follower circuit of the pre-stage circuit 10a has no gain (equal to one), but has a wide band, and the band and the gain G of the signal amplifier 1a are determined by the traveling-wave amplifier of the post-stage circuit 11. As a result, since the input impedance of the post-stage circuit 11 is set to a low value, it is possible to improve the cut-off frequency in the traveling-wave amplifier of the post-stage circuit 11, and the input reflection loss characteristic is also improved.

Figure 9:
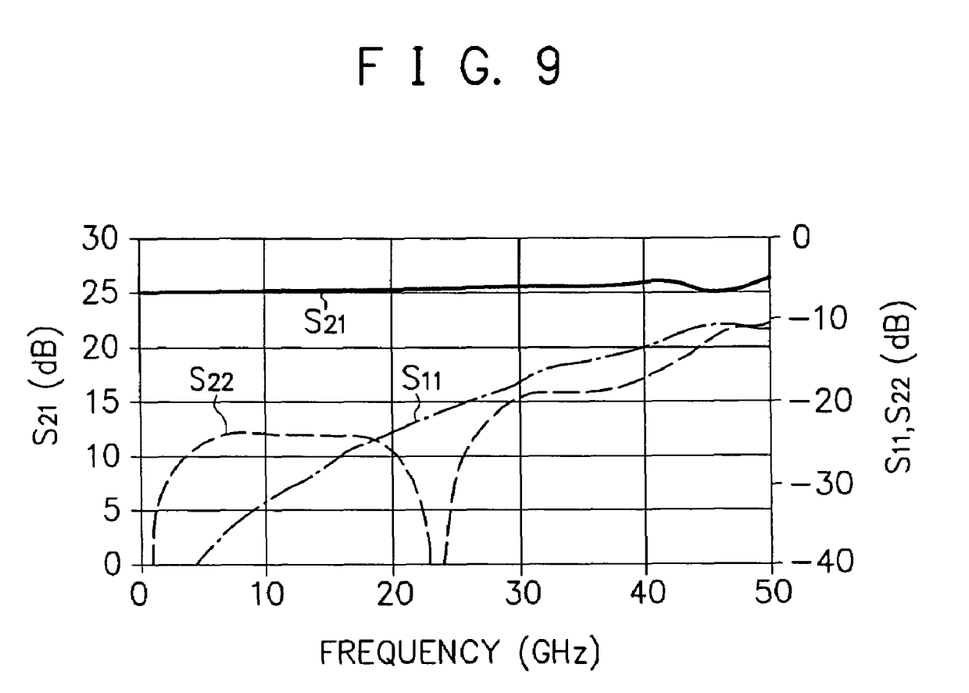

FIG. 9 is a diagram showing comparison of frequency characteristics of the gain G ($S_{11}$), the input reflection ($S_{21}$), and the output reflection ($S_{22}$) when the system includes the signal amplifier 1a.

As shown in FIG. 9, also in the configuration of the signal amplifier 1a, it can be recognized that the gain G ($S_{11}$), the input reflection ($S_{21}$), and the output reflection ($S_{22}$) are improved. Additionally, also in the example of FIG. 9 in which the unit of frequency along the abscissa is "GHz", it can be confirmed according to experimental results that the gain G ($S_{11}$), the input reflection ($S_{21}$), and the output reflection ($S_{22}$) are improved in a wide band (a frequency range of about six figures) from several tens of kHz (e.g., about 30 kHz) to 50 GHz.

In this regard, judging from experimental results, it can be considered that the gain G ($S_{11}$), the input reflection ($S_{21}$), and the output reflection ($S_{22}$) are improved in a wider band, namely, a band (a frequency range of about eight figures) from several tens of kHz to 200 GHz.

As described above, in the configuration according to the second embodiment, it is possible as in the first embodiment to suppress reduction in the cut-off frequency and deterioration of the input reflection loss and hence a high gain and a high power output can be attained in a wide band from several tens of kHz to several tens of GHz (a frequency range of about six figures).

Incidentally, in the description of the configuration of the second embodiment, the pre-stage circuit 10a includes a two-stage emitter-follower circuit. However, even when the emitter-follower circuit includes one stage or more than three stages, the similar advantage can be obtained if the output impedance of the pre-stage circuit 10a matches the input impedance of the post-stage circuit 11.

Furthermore, in the configuration of the second embodiment, the post-stage circuit 11 includes grounded-emitter transistors. However, the similar advantage can be obtained by a traveling-wave amplifier in a cascode configuration in which a grounded-emitter transistor is connected to a grounded-base transistor.

Moreover, in the third embodiment, the pre-stage circuit 10a and the post-stage circuit 11 include bipolar transistors. However, other amplifying elements such as FETs and metal oxide semiconductor field-effect transistors (MOSFETs) may also be used to configure the circuits. When FETs and/or MOSFETs are employed in the pre-stage circuit 10a, a source-follower circuit is provided in the configuration.

Third Embodiment

Figure 10:
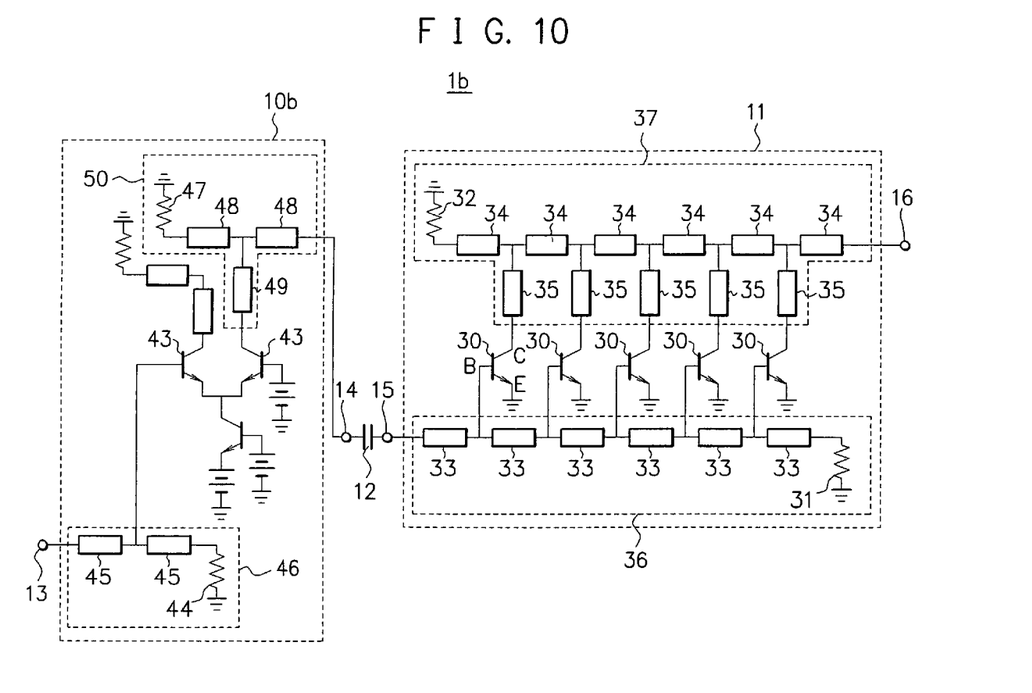
FIG. 10 is a diagram showing an outline of a configuration example of a signal amplifier in a third embodiment.

Referring next to FIG. 10, description will be given of a configuration of a signal amplifier in a third embodiment of the present invention.

FIG. 10 is a diagram showing an outline of a configuration example of a signal amplifier in the third embodiment.

Incidentally, in a signal amplifier 1b of the third embodiment, the same constituent components as those of the signal amplifier 1 of the first embodiment will be designated by the same reference numerals, and the duplicated description thereof will be avoided.

As shown in FIG. 10, the signal amplifier 1b includes a pre-stage circuit 10b to input a signal from an external device and a post-stage circuit 11 to amplify a signal fed from the pre-stage circuit 10b to output the signal therefrom.

Additionally, the pre-stage circuit 10b and the post-stage circuit 11 are formed on one and the same substrate together with a direct-current (DC) bias circuit, not shown, to configure an integrated circuit.

The pre-stage circuit 10b shown in FIG. 10 includes a one-stage differential circuit including transistors 43. By including the differential circuit, the pre-stage circuit 10a has a function as an impedance transforming circuit. Moreover, in the pre-stage circuit 10b, each distributed constant line 45 and an input-side terminating resistor 44 configure an input-side coupling circuit 46. Moreover, an output-side terminating resistor 47, each distributed constant line 48, and a phase adjusting line 49 configure an output-side coupling circuit 50.

In the configuration of the signal amplifier 1b described above, when the input-side external impedance is, for example, 50 Ω, the input impedance of the pre-stage circuit 10b (impedance of the input-side coupling circuit 46) is set to 50 Ω to match the input-side external impedance. In the configuration, by disposing a differential circuit in the pre-stage circuit 10, the input impedance of the pre-stage circuit 10 and the output impedance of the post-stage circuit 11 match the external impedance in a one or more-digit frequency range. Additionally, the output impedance of the post-stage circuit 11 (impedance of the output-side coupling circuit 37) is set to 50 Ω to match the output-side external impedance as in the first embodiment. Moreover, the output impedance of the pre-stage circuit 10b (impedance of the output-side coupling circuit 50) and the input impedance of the post-stage circuit 11 (impedance of the input-side coupling circuit 36) are set to, for example, 15 Ω to match at impedance lower than the output impedance of the post-stage circuit 11 (impedance of the output-side coupling circuit 37).

Furthermore, even when the differential circuit of the pre-stage circuit 10b has a small gain, the gain G of the signal amplifier 1b is determined by the traveling-wave amplifier of the post-stage circuit 11 as in the first and second embodiments.

Figure 11:
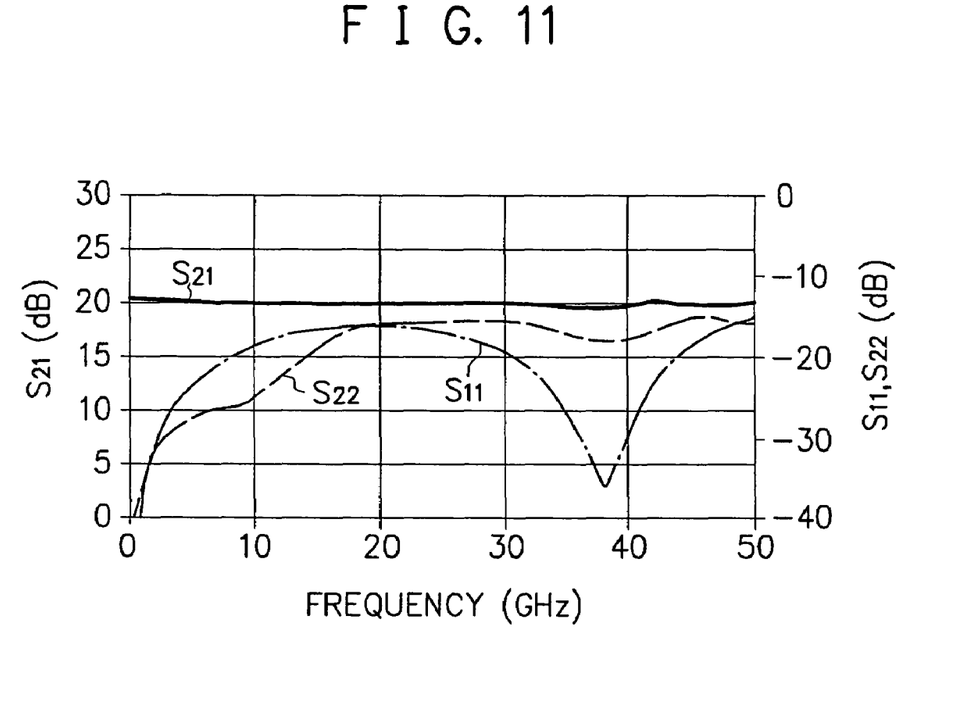
FIG. 11 is a diagram showing comparison of frequency characteristics of a gain G ($S_{11}$), input reflection ($S_{21}$), and output reflection ($S_{22}$) when the system includes a signal amplifier 1b.

FIG. 11 is a diagram showing comparison of frequency characteristics of the gain G ($S_{11}$), the input reflection ($S_{21}$), and the output reflection ($S_{22}$) when the system includes the signal amplifier 1b.

As shown in FIG. 11, also in the configuration of the signal amplifier 1b, it can be recognized that the gain G ($S_{11}$), the input reflection ($S_{21}$), and the output reflection ($S_{22}$) are improved. Additionally, also in the example of FIG. 11 in which the unit of frequency along the abscissa is "GHz", it can be confirmed according to experimental results that the gain G ($S_{11}$), the input reflection ($S_{21}$), and the output reflection ($S_{22}$) are improved in a wide band (a frequency range of about six figures) from several tens of kHz (e.g., about 30 kHz) to 50 GHz.

In this regard, judging from experimental results, it can be considered that the gain G ($S_{11}$), the input reflection ($S_{21}$), and the output reflection ($S_{22}$) are improved in a wider band, namely, a band (a frequency range of about eight figures) from several tens of kHz to 200 GHz.

As described above, in the configuration according to the third embodiment, the pre-stage circuit 10b includes a differential circuit, and it is possible as in the first embodiment to suppress reduction in the cut-off frequency and deterioration of the input reflection loss. Hence, a high gain and a high power output can be attained in a wide band from several tens of kHz to several tens of GHz (a frequency range of about six figures).

Incidentally, in the description of the configuration of the third embodiment, the pre-stage circuit 10b includes a one-stage differential circuit and a distributed constant line. However, even when the differential circuit includes two or more stages or includes an emitter-follower circuit, the similar advantage can be obtained if the output impedance of the pre-stage circuit 10b matches the input impedance of the post-stage circuit 11.

Furthermore, in the configuration of the third embodiment, the post-stage circuit 11 includes grounded-emitter transistors. However, the similar advantage can be obtained by a traveling-wave amplifier in a cascode configuration in which a grounded-emitter transistor is connected to a grounded-base transistor.

Additionally, in the third embodiment, the pre-stage circuit 10b and the post-stage circuit 11 include bipolar transistors. However, other amplifying elements such as FETs and metal oxide semiconductor field-effect transistors (MOSFETs) may also be used to configure the circuit.

Also, in the configurations of the first to third embodiments, the capacitor may be formed on the substrate on which the pre-stage circuit and the post-stage circuit are formed or may be formed as a chip condenser at a position outside the substrate.

Moreover, in the configurations of the first to third embodiments, the pre-stage circuit and the post-stage circuit are formed on the same substrate. However, it is also possible that the pre-stage circuit and the post-stage circuit are formed on different substrates to be connected at a position outside the substrate using a chip condenser as a capacitor.

In addition, in the configurations of the first to third embodiments, when the power source voltage is selected such that the DC bias of the pre-stage circuit matches that of the post-stage circuit, the capacitor can be dispensed with.

Furthermore, although the signal produced from the pre-stage circuit is fed via the capacitor 12 to the post-stage circuit in the configurations of the first to third embodiments, the signal may be inputted via another circuit such as an amplifier to the post-stage circuit.

INDUSTRIAL APPLICABILITY

As set fourth hereinabove, in accordance with the present invention, the input impedance of the pre-stage circuit and the output impedance of the post-stage circuit match the external impedance in a one or more-digit frequency range and the output impedance of the pre-stage circuit matches the input impedance of the post-stage circuit at impedance lower than the output impedance of the post-stage circuit. Therefore, it is possible to suppress lowering of the cut-off frequency and deterioration of the input reflection loss which are caused by the increase in the size and the number of stages of transistors to obtain high voltage amplitude, and a high gain and a high power output can be attained in a wide band, for example, from several tens of kHz to several tens of GHz (a frequency range of about six figures).

The invention claimed is:

1. A signal amplifier, characterized by comprising a pre-stage circuit for inputting a signal from an external device and a post-stage circuit for amplifying the signal fed from the pre-stage circuit and outputting the signal therefrom, wherein:

input impedance of the pre-stage circuit and output impedance of the post-stage circuit are set to match external impedance in a frequency range of at least several tens of kHz to several tens of GHz; and output impedance of the pre-stage circuit and input impedance of the post-stage circuit are set to match at impedance lower than the output impedance of the post-stage circuit;

wherein the pre-stage circuit includes an impedance transforming circuit; and wherein the impedance transforming circuit includes a differential circuit.

2. A signal amplifier, characterized by comprising a pre-stage circuit for inputting a signal from an external device and a post-stage circuit for amplifying the signal fed from the pre-stage circuit and outputting the signal therefrom, wherein:

input impedance of the pre-stage circuit and output impedance of the post-stage circuit are set to match external impedance in a one or more-digit frequency range; and output impedance of the pre-stage circuit and input impedance of the post-stage circuit are set to match at impedance lower than the output impedance of the post-stage circuit; and wherein an output section of the pre-stage circuit is connected via a capacitor to an input section of the post-stage circuit.

3. A signal amplifier, characterized by comprising a pre-stage circuit for inputting a signal from an external device and a post-stage circuit for amplifying the signal fed from the pre-stage circuit and outputting the signal therefrom, wherein:

input impedance of the pre-stage circuit and output impedance of the post-stage circuit are set to match external impedance in a one or more-digit frequency range; and output impedance of the pre-stage circuit and input impedance of the post-stage circuit are set to match at impedance lower than the output impedance of the post-stage circuit;

wherein the pre-stage circuit includes an impedance transforming circuit; and wherein the impedance transforming circuit includes a differential circuit.

4. A signal amplifier, characterized by comprising a pre-stage circuit for inputting a signal from an external device and a post-stage circuit for amplifying the signal fed from the pre-stage circuit and outputting the signal therefrom, wherein:

input impedance of the pre-stage circuit and output impedance of the post-stage circuit are set to match external impedance in a one or more-digit frequency range; and output impedance of the pre-stage circuit and input impedance of the post-stage circuit are set to match at impedance lower than the output impedance of the post-stage circuit;

wherein the post-stage circuit includes a traveling-wave amplifier; and wherein an output section of the pre-stage circuit is connected via a capacitor to an input section of the post-stage circuit.

5. A signal amplifier, characterized by comprising a pre-stage circuit for inputting a signal from an external device and a post-stage circuit for amplifying the signal fed from the pre-stage circuit and outputting the signal therefrom, wherein:

input impedance of the pre-stage circuit and output impedance of the post-stage circuit are set to match external impedance in a one or more-digit frequency range; and output impedance of the pre-stage circuit and input impedance of the post-stage circuit are set to match at impedance lower than the output impedance of the post-stage circuit;

wherein the pre-stage circuit includes an impedance transforming circuit; and wherein an output section of the pre-stage circuit is connected via a capacitor to an input section of the post-stage circuit.

6. A signal amplifier in accordance with claim 1, wherein an output section of the pre-stage circuit is connected via a capacitor to an input section of the post-stage circuit.

* * * * *